United States Patent
Parks

(10) Patent No.: US 7,254,900 B2
(45) Date of Patent: *Aug. 14, 2007

(54) WAFER EDGE WHEEL WITH DRYING FUNCTION

(75) Inventor: John Parks, Hercules, CA (US)

(73) Assignee: Lam Research Corporation, Fremont, CA (US)

( * ) Notice: Subject to any disclaimer, the term of this patent is extended or adjusted under 35 U.S.C. 154(b) by 36 days.

This patent is subject to a terminal disclaimer.

(21) Appl. No.: 11/395,893

(22) Filed: Mar. 31, 2006

(65) Prior Publication Data

US 2006/0174510 A1    Aug. 10, 2006

Related U.S. Application Data

(62) Division of application No. 10/957,146, filed on Sep. 30, 2004, now Pat. No. 7,089,687.

(51) Int. Cl.
*F26B 19/00* (2006.01)
(52) U.S. Cl. ......................................... 34/78
(58) Field of Classification Search ............ 34/77, 34/78, 79, 80
See application file for complete search history.

(56) References Cited

U.S. PATENT DOCUMENTS

| | | | |
|---|---|---|---|
| 4,838,289 A | 6/1989 | Kottman et al. | |
| 4,968,375 A * | 11/1990 | Sato et al. | 156/345.23 |
| 5,088,441 A | 2/1992 | Bell | |
| 5,271,774 A | 12/1993 | Leenaars et al. | |
| 5,660,642 A | 8/1997 | Britten | |
| 5,705,223 A | 1/1998 | Bunkofske | |
| 5,724,748 A * | 3/1998 | Brooks et al. | 34/90 |
| 5,729,856 A | 3/1998 | Jang et al. | |
| 5,945,351 A | 8/1999 | Mathuni | |
| 5,967,882 A | 10/1999 | Duescher | |
| 5,997,653 A | 12/1999 | Yamasaka | |
| 6,035,549 A * | 3/2000 | Chevalier et al. | 34/381 |
| 6,102,777 A | 8/2000 | Duescher et al. | |
| 6,186,873 B1 * | 2/2001 | Becker et al. | 451/54 |
| 6,398,975 B1 | 6/2002 | Mertens et al. | |
| 6,435,200 B1 * | 8/2002 | Langen | 134/99.1 |
| 6,491,764 B2 | 12/2002 | Mertens et al. | |
| 6,550,091 B1 | 4/2003 | Radman et al. | |
| 6,622,334 B1 | 9/2003 | Ziemins et al. | |
| 6,851,435 B2 * | 2/2005 | Mertens et al. | 134/99.1 |
| 6,907,637 B1 * | 6/2005 | Pena | 15/77 |
| 7,000,622 B2 * | 2/2006 | Woods et al. | 134/94.1 |

(Continued)

FOREIGN PATENT DOCUMENTS

EP    0 905 746 A1    3/1999

(Continued)

OTHER PUBLICATIONS

U.S. Appl. No. 11/292,465, filed Dec. 2, 2005, Yun et al.

(Continued)

*Primary Examiner*—S. Gravini

(57) ABSTRACT

An edge wheel for supporting and rotating a disk-shaped substrate includes a wheel body having a peripheral groove configured to support an edge of a substrate and at least one radial channel extending into said wheel body from said peripheral groove. An edge wheel dryer and a method for processing a disk-shaped substrate are also described.

12 Claims, 3 Drawing Sheets

U.S. PATENT DOCUMENTS

| | | |
|---|---|---|
| 7,089,687 B2 * | 8/2006 | Parks .................. 34/380 |
| 2002/0050244 A1 | 5/2002 | Engesser |
| 2002/0121290 A1 | 9/2002 | Tang et al. |
| 2002/0125212 A1 | 9/2002 | Mertens et al. |
| 2005/0132953 A1 | 6/2005 | Davis et al. |
| 2006/0000494 A1 | 1/2006 | Garcia et al. |

FOREIGN PATENT DOCUMENTS

| | | |
|---|---|---|
| EP | 1 372 186 A2 | 10/2000 |
| JP | 02 280330 A | 11/1990 |
| JP | 02 309638 A | 12/1990 |
| JP | 11 350169 A | 12/1999 |
| WO | WO99/16109 A1 | 4/1999 |
| WO | WO 02/101795 A2 | 12/2002 |

OTHER PUBLICATIONS

U.S. Appl. No. 11/429,574, filed May 5, 2006, Yoon et al.

* cited by examiner

WAFER EDGE WHEEL WITH DRYING FUNCTION

CLAIM OF PRIORITY

This Application is a Divisional of prior application Ser. No. 10/957,146, filed Sep. 30, 2004 now U.S. Pat. No. 7,089,687, from which priority under 35 U.S.C. § 120 is claimed.

BACKGROUND OF THE INVENTION

1. Field of the Invention

The present invention relates generally an edge wheel for a substrate used in wafer cleaning and other operations.

2. Description of the Related Art

Silicon wafers and other substrate materials used in integrated circuit manufacturing must be planarized and polished to meet stringent surface flatness requirements. One common technique for planarizaiton is known as chemical-mechanical planarization/polishing or CMP. CMP is essentially mechanical polishing in which the slurry used is also an etchant for the surface to be polished. After CMP processing, contaminated substrates are cleaned. In one step of cleaning, the surfaces of the substrate are brushed while a cleaning fluid is applied. To dry the substrate, it is supported by a plurality of edge wheels at the edges of the wafer and spun. Other methods of drying in which the wafer is supported by edge wheels are feasible as well. The spinning causes most of the fluid to fly off the substrate. However, due to surface tension, some fluid tends to remain at the edges. In addition, a meniscus can form at the interface of the edge wheels and the substrate. And finally, some liquid may remain on the edge wheel and re-wet the substrate as it spins around.

It is possible to remove some fluid by applying suction to the edge of the wafer or at the edge of the wheel, but heretofore, there has been no way of effectively removing fluid at the interface of the edge wheel and the substrate.

SUMMARY OF THE INVENTION

Broadly speaking, the present invention fills these needs by providing an edge wheel with an integrated fluid suction and fluid supply capability.

It should be appreciated that the present invention can be implemented in numerous ways, including as a process, an apparatus, a system, a device, or a method. Several inventive embodiments of the present invention are described below.

In one embodiment, an edge wheel for supporting and rotating a disk-shaped substrate, such as a semiconductor substrate, includes a wheel body having a peripheral groove configured to support an edge of a substrate and at least one radial channel extending into said wheel body from said peripheral groove.

In one embodiment, an edge wheel assembly for a substrate processing apparatus includes an edge wheel having a wheel body with a groove formed in an outer periphery of said wheel body. The groove is configured to engage an edge of the substrate. Furthermore, a through-hole is formed at an axis of the edge wheel to allow the edge wheel to rotate on a shaft. A radial channel extends inward from said groove. The radial channel is in at least periodic fluid communication with a stationary port as the edge wheel rotates on said shaft.

In another embodiment, an edge wheel dryer includes a plurality of edge wheels, each having a groove configured to engage an edge of a substrate. At least one of the edge wheels has a radial channel extending inward from its groove. The dryer also includes a vacuum source. The radial channel is in fluid communication with the vacuum source.

In another embodiment, a method for processing a substrate includes rotationally supporting the substrate on a plurality of edge wheels, spinning the substrate, and performing one of a wetting and drying operation at an interface between the substrate and at least one of the edge wheels. The substrate is rotationally supported by a plurality of edge wheels each having a groove at its periphery that engages the edge of the substrate. Each edge wheel is allowed to rotate on its axis thereby allowing the substrate to rotate on its axis. Spinning is achieved by applying a rotational force to at least one of the edge wheels thereby causing the substrate to spin. Wetting comprises supplying a liquid to the interface via radial channels formed in the at least one edge wheel. Drying comprises supplying a vacuum to the interface via the radial channels The advantages of the present invention are numerous and will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

Figure 1:
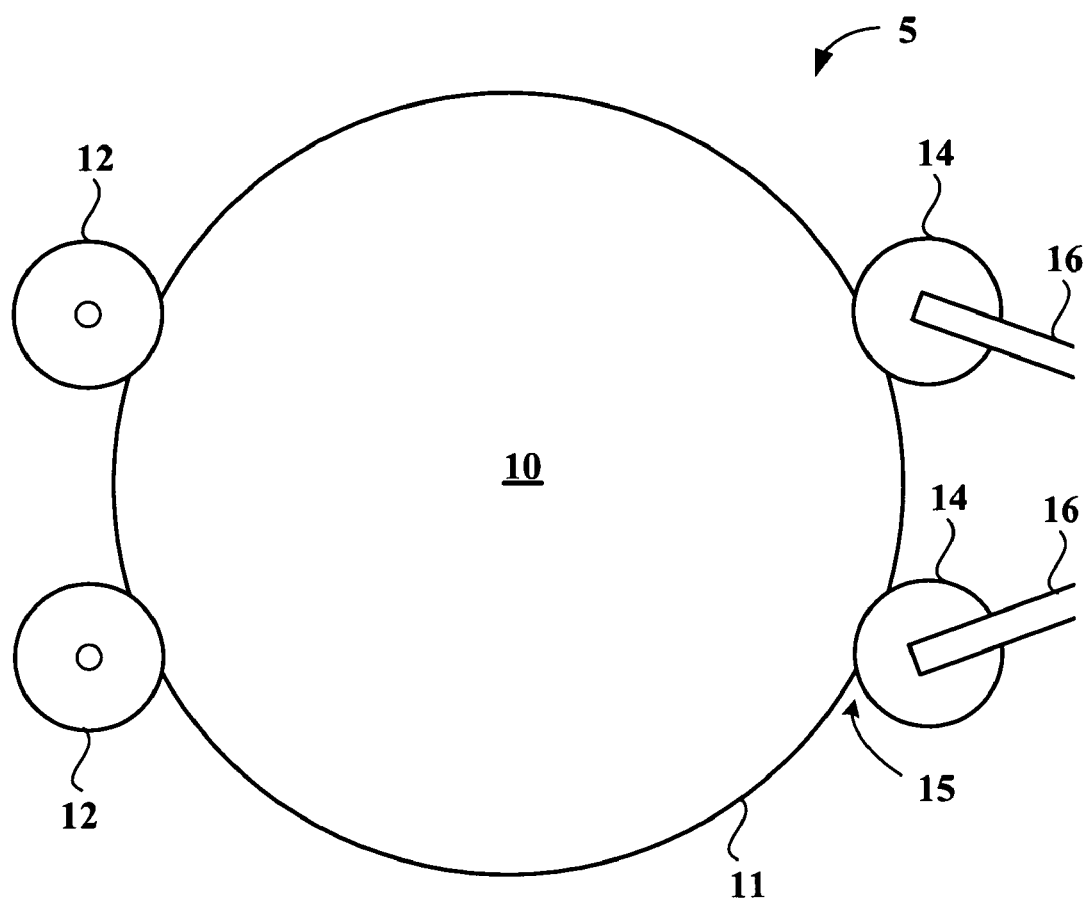
FIG. 1 shows a plan view of an exemplary substrate cleaning system.

FIG. 1 shows an exemplary layout of substrate processing device 5. Substrate 10 is disk-shaped and is supported by four edge wheels 12, 14, including two fixed edge wheels 12 and two movable edge wheels 14. Edge wheels 14 pivot into engagement with substrate 10 by support arms 16 when substrate 10 is loaded into the apparatus. Loading may be performed by a robot (not shown) that positions substrate 10 into place before movable edge wheels 14 engages substrate 10.

Edge wheels 12, 14 allow substrate 10 to rotate on its axis of symmetry which is perpendicular to the flat surfaces of the substrate. One or both fixed edge wheels 12 may be provided with some rotational force, e.g., by a friction wheel, belt drive or other drive means (not shown in FIG. 1) as would generally occur to those having skill in the art. Thus, edge wheels 12, 14 maintain the position of substrate 10 while allowing it and/or causing it to rotate on its axis while supporting substrate 10 only by its edges.

Figure 2:
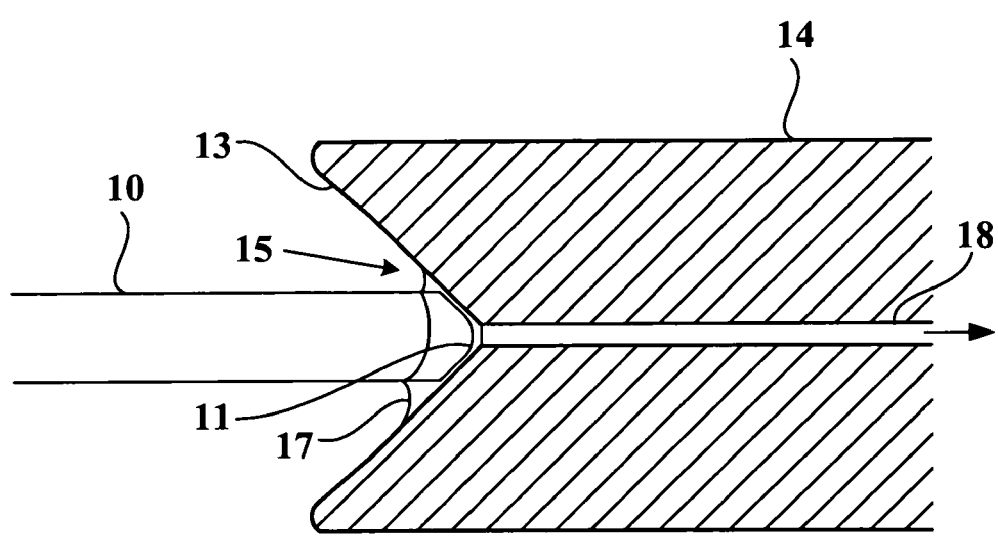
FIG. 2 shows a close up view of an interface between a substrate and edge wheel.

FIG. 2 shows a close up of interface 15 formed between substrate 10 and edge wheel 14. Edge wheel 14 has a groove 13 formed in its outer circumference configured to engage edge 11 of substrate 10. Meniscus 17 formed by liquid is shown by way of example as being located at an interface of substrate 10 and edge wheel 14 wherein both the substrate and edge wheel are hydrophilic. However, it is also possible that only one or neither of substrate 10 and edge wheel 14 is hydrophilic. The liquid may be a cleaning solution, rinsing agent, or other chemical used in processing substrates.

A plurality of radial channels 18 are formed into edge wheel 14 extending inward from groove 13. Radial channels 18 are in fluid communication with a vacuum source or a fluid supply (not shown in FIG. 2). When suction is applied to radial channel 18, any liquid at the interface between substrate 10 and edge wheel 14 will be removed. All four edge wheels 12, 14, may be provided with radial channel 18. Furthermore, edge 11 of substrate 10 may be wetted by supplying fluid to radial channel 18.

Figure 3:
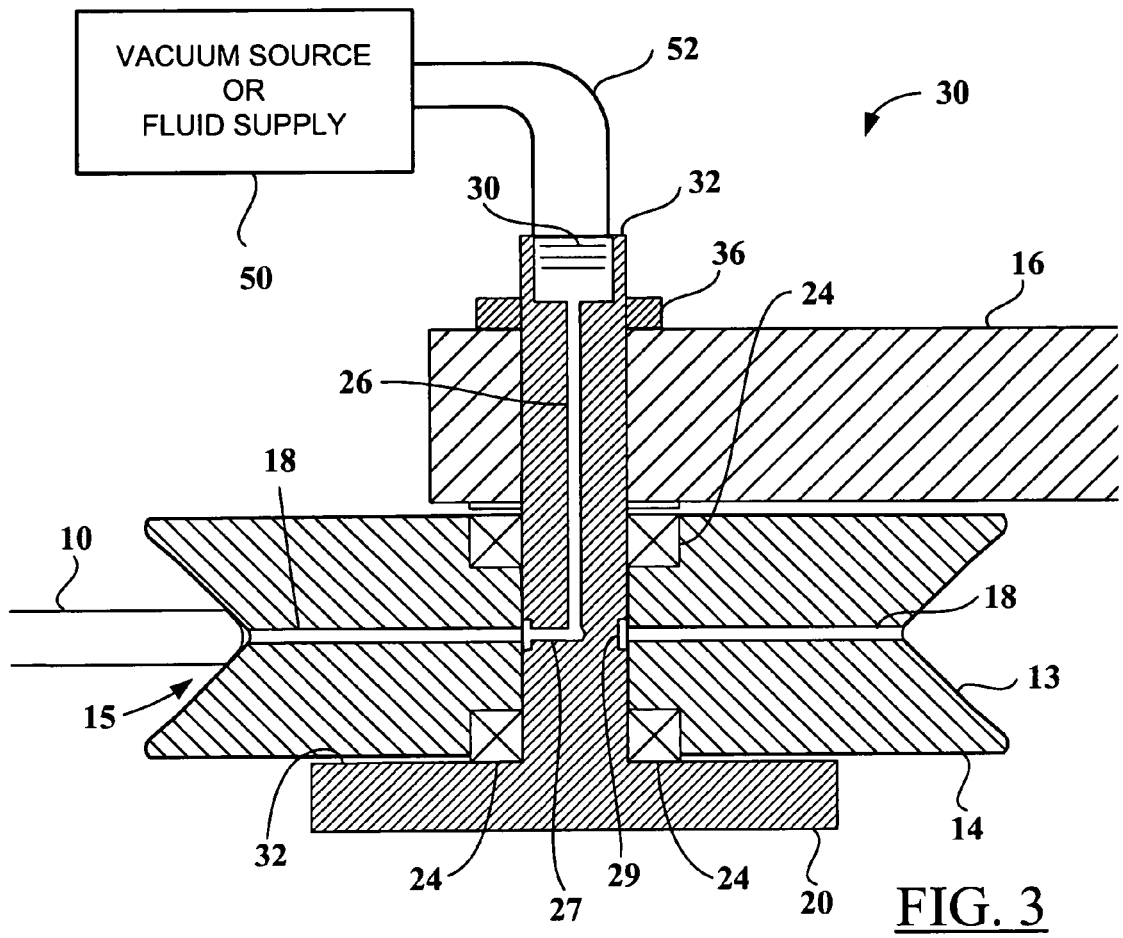
FIG. 3 shows a cross section view of an exemplary edge wheel assembly.
Figure 4:
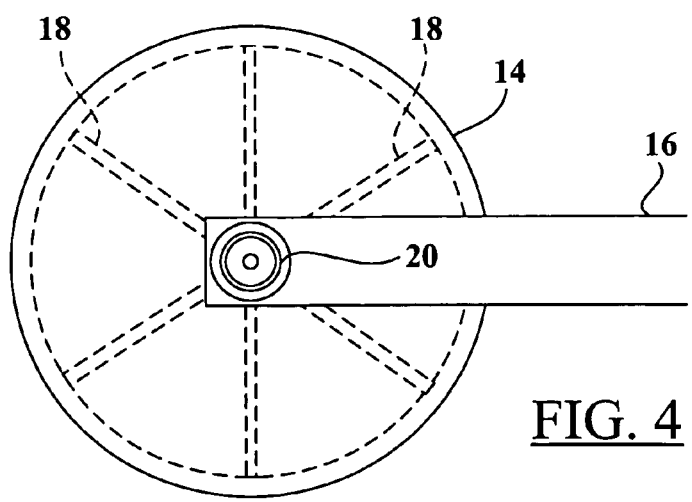
FIG. 4 shows a top view of the exemplary edge wheel assembly of FIG. 3.

FIG. 3 shows an exemplary edge wheel assembly 30. Edge wheel 14 is mounted to a support arm 16 by a shaft 20 such that the edge wheel is free to rotate. Edge wheel 14 and shaft 20 are shown in cross section so that the internal structure can be seen. Specifically, shaft 20 includes an axial channel extending from a top end 32 to a transverse channel 27. Transverse channel 27 periodically aligns with each of radial channels 18 which are formed radially into edge wheel 14. Any number of transverse channels may be formed into edge wheel and shaft 20 so long as the strength is not unduly compromised. In one embodiment, one transverse channel is formed into shaft 20 and six radial channels are formed in edge wheel 14 as shown in phantom in FIG. 4. The term, "radial channel" is not intended to be limiting as it requires only that the channels extend into the body of wheel 14 from groove 13.

Shaft 20 extends axially through edge wheel 14, and bearings 24 permit edge wheel 14 to rotate on shaft 20. For example, bearings 24 may be made of some low friction self-lubricating resin such as polytetrafluoroethene (PTFE) or nylon. Composite materials such as that sold under the trademark, RULON by Saint-Gobain Performance Plastics Microelectronics of Garden Grove, Calif., are also contemplated. Bearings 24 are closely fit to shaft 20 to reduce leakage through the interface of edge wheel 14 and shaft 20.

Groove 29 extends around the circumference of shaft 20 at the interface between channel 27 and channels 18 so that continuous suction is drawn from all channels 18. Alternatively, a similar groove may be formed on the inner diameter of edge wheel 14. Alternative to providing a groove 29, a gap (not shown) between shaft 20 and edge wheel 14 may be large enough so that vacuum may be communicated through the gap formed therebetween. Alternatively, it may be desirable to prevent vacuum from being communicated to any channel 18 not in alignment with interface 15. In this case, no groove 29 is provided, and a single transverse channel 27 may be aligned as shown so that fluid is only drawn from channels 18 when they are aligned with interface 15 between substrate 10 and edge wheel 14.

A suction line 52 may be coupled at top 32 of shaft 20, e.g., using threads 31 or some other fluid line engaging means such as clamps, friction teeth, nipple, etc., to provide communication between axial channel 26 and a vacuum source 50.

In a first operation, wafer 10 is dried by spinning it, which draws fluid out from the center toward edge 11. Some fluid may adhere at edge 11. To remove this fluid, suction is applied to suction line 52 which is in at least periodic fluid communication with each radial channel 18 and therefore interface 15. Suction draws out any fluid at interface 15 while substrate 10 and edge wheel 14 rotate, thereby drying edge wheel 14.

Alternatively, in certain processes, another mechanism is used to wet the wafer from being dried by the action of edge wheels. To prevent the edges from being dried by this action, a fluid may supplied to wheel assembly 30 for wetting edge 11 of substrate 10. This allows the wafer to be made uniformly wet with the particular fluid being used. In this circumstance, it may not be necessary to provide so much pressure as to generate a spray, but rather enough so the edge of substrate 10 is made uniformly wet.

Figure 5:
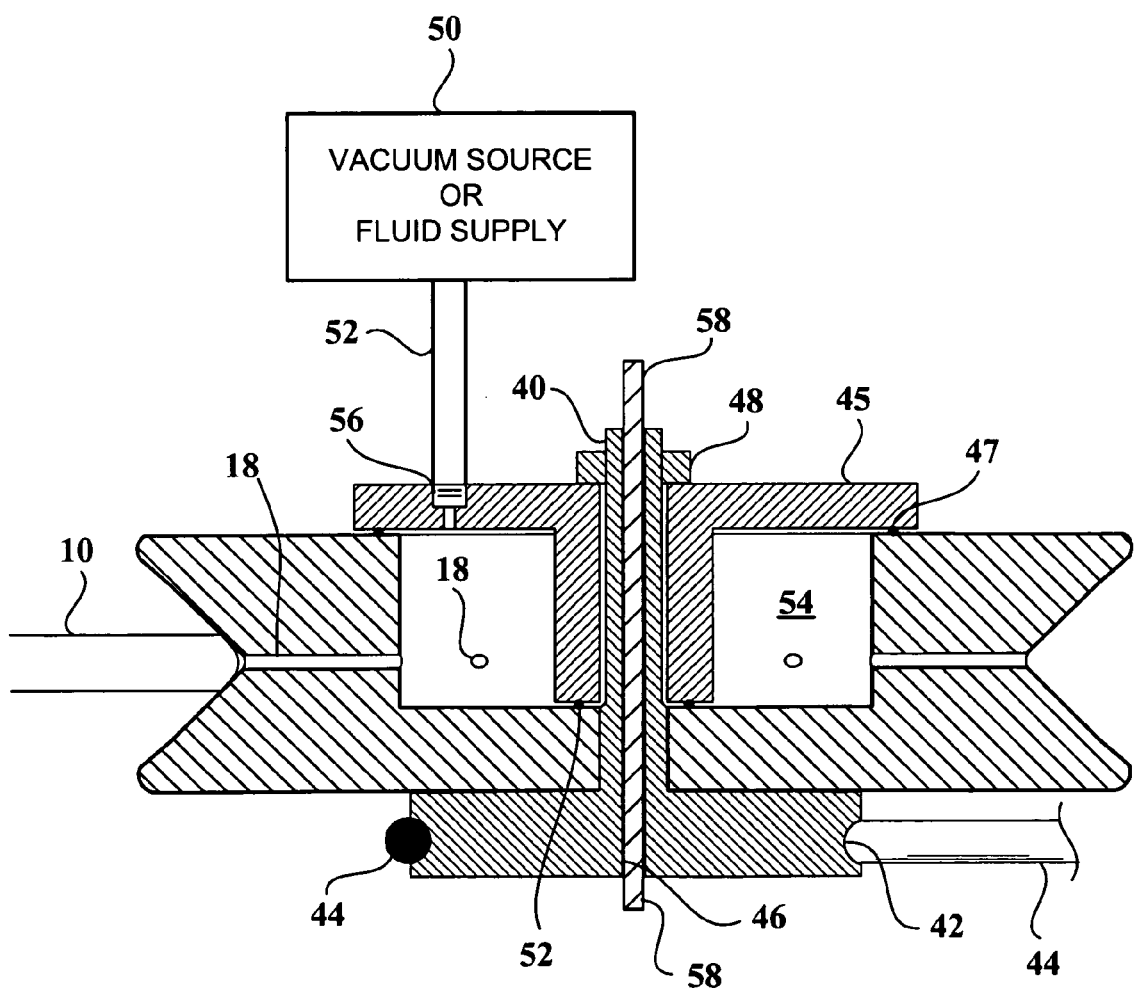
FIG. 5 shows a cross section view of another exemplary edge wheel assembly.

FIG. 5 shows an exemplary cross section view of fixed edge wheel 12. Fixed edge wheel 12 includes a shaft 40 extending through the body of wheel 12. Shaft 40 rotates with edge wheel 12 on a pin 58 that passes through axial through-hole 46. An annular space 54 is formed between a cavity in edge wheel 12 and a cover 45, which has a T-shaped cross section. Retainer 48 retains cover 45 on edge wheel 12, and may be separated therefrom by a low-friction washer (not shown) to allow relative rotation. Retainer 48 may be, e.g., a nut. Cover 45 is sealed to edge wheel 12 by O-rings 47. A belt 44 engages groove 42 forming a pulley in a lower portion of shaft 40.

In operation, a drive source (not shown) drives belt 44 which engages groove 42 thereby turning shaft 40 on a pin (not shown) that passes through axial through-hole 46. Shaft 46 is fixedly attached to edge wheel 12 by mechanical means, adhesive, or other means. Alternatively, shaft 46 and edge wheel 12 may be integrally formed of a single material. T-shaped cover 45 remains stationary. A vacuum is applied at port 56 to place annular space 54 in a partial vacuum. Alternatively, a fluid may be supplied to annular space 54 via port 56. Annular space 54 is in fluid communication with radial channels 18 which operate as described above with respect to edge wheel 14 shown in FIG. 3.

While a belt drive mechanism is shown, it should be apparent that any known drive means could be used to impart rotation to edge wheel 12. Furthermore, movable edge wheels 14 could be integrated with a drive means.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A wafer handling apparatus for handling a semiconductor wafer, said wafer handling apparatus comprising:

a plurality of edge wheels arranged for rotatably supporting the wafer, each of the edge wheels comprising a wheel body having a groove formed in an outer periphery of said wheel body, said groove being configured to engage an edge of said wafer such that the wafer may be inserted into the groove and supported by the groove, each of the edge wheels having an axis upon which the edge wheel is configured to rotate, wherein at least one of the edge wheels has a radial channel extending into the wheel body from said groove and a through-hole formed along the axis of the at least one edge wheel;

a shaft extending through said through-hole, the shaft supporting the wheel body for rotation about the shaft, said radial channel being in at least periodic fluid communication with a stationary port on one of said edge wheel and said shaft as said edge wheel rotates on said shaft.

2. The wafer handling apparatus of claim 1, wherein said shaft comprises an internal channel that comprises an axial channel extending from one end of said shaft to a point proximate said radial channel, and at least one transverse channel extending from said axial channel to an outer periphery of said shaft proximate said radial channel, said radial channel extending to the through-hole thereby placing the axial channel of the shaft in at least periodic fluid communication with the radial channel as the edge wheel rotates on the shaft, said port comprising a connection at said one end for attaching a fluid line in fluid communication with said internal channel, the fluid line extending from the shaft to the source of fluid pressure.

3. The wafer handling apparatus of claim 2, wherein said edge wheel is mounted to said shaft using a bearing, said bearing being closely toleranced to said shaft and said edge wheel to minimize fluid leaks from an interface between said edge wheel and said shaft.

4. The wafer handling apparatus of claim 1, further comprising a moving arm that selectively moves said edge wheel into engagement with said wafer when the wafer is positioned between a plurality of said edge wheels.

5. The wafer handling apparatus of claim 1, wherein said edge wheel further comprises an annular chamber and a cover, said at least one radial channel extending from said groove to said annular chamber which is formed between said edge wheel and said cover, said cover being sealed to said edge wheel such that said cover and said edge wheel can rotate with respect to each other, said port comprising a connection on said cover for attaching a fluid line.

6. The wafer handling apparatus of claim 1, further comprising a pulley fixed to said edge wheel, the pulley allowing the edge wheel to be rotated by a belt, wherein rotation of the edge wheel causes the wafer to rotate.

7. An edge wheel dryer comprising:
a plurality of edge wheels, wherein each of the edge wheels has an axis upon which the edge wheel is configured to rotate, and each of the edge wheels has a groove configured to engage an edge of the wafer such that the edge of the wafer is inserted into each groove thereby supporting the wafer by the plurality of edge wheels, the edge wheels being arranged to receive and support the wafer, at least one of said edge wheels having a radial channel extending inward from said groove; and a vacuum source, said radial channel being in fluid communication with said vacuum source whereby the vacuum source causes suction of fluids from the groove.

8. The edge wheel dryer of claim 7 wherein one or more of said edge wheels comprises a drive means for receiving force causing said one or more edge wheel to rotate thereby causing said wafer to spin.

9. The edge wheel dryer of claim 7 wherein one or more of said edge wheels is mounted to a movable arm, said movable arm causing said one or more edge wheel to engage said edge of said substrate when said substrate is received and supported by said plurality of edge wheels.

10. The wafer handling apparatus of claim 1, further comprising a vacuum source connected to the vacuum port by a vacuum line, the vacuum source thereby being in at least periodic fluid communication with the radial channel.

11. The wafer handling apparatus of claim 1, further comprising a supply of wetting liquid connected to the vacuum port by a supply line, the fluid supply thereby supplying the wetting liquid to the groove by way of the radial channel.

12. The wafer handling apparatus of claim 1, wherein each edge wheel includes the radial channel and the vacuum port.

* * * * *